United States Patent [19]
Kita et al.

[11] 4,327,273
[45] Apr. 27, 1982

[54] METHOD OF TREATING A WORKPIECE WITH ELECTRON BEAMS AND APPARATUS THEREFOR

[75] Inventors: Hisanao Kita; Yoshinori Karatsu; Takamitsu Nakazaki; Yoji Akutsu, all of Ibaraki, Japan

[73] Assignee: Hitachi, Ltd., Tokyo, Japan

[21] Appl. No.: 131,857

[22] Filed: Mar. 19, 1980

[30] Foreign Application Priority Data

Mar. 23, 1979 [JP] Japan ................................ 54-34768
Jun. 6, 1979 [JP] Japan ................................ 54-70038

[51] Int. Cl.³ .......................................... B23K 15/00
[52] U.S. Cl. ..................... 219/121 EC; 219/121 EL; 219/121 ES; 219/121 EX
[58] Field of Search ................. 219/121 EC, 121 ED, 219/121 EX, 121 EY, 121 EB, 121 ER, 121 ES, 121 EZ

[56] References Cited

U.S. PATENT DOCUMENTS

| | | | |
|---|---|---|---|
| Re. 27,005 | 12/1970 | Wingfield et al. | 219/121 EC X |
| 3,082,316 | 3/1963 | Greene | 219/121 EC |
| 3,378,670 | 4/1968 | Smith et al. | 219/121 E UX |
| 3,417,222 | 12/1968 | Cannon et al. | 219/121 EP X |
| 3,479,483 | 11/1969 | Boring et al. | 219/121 EG |
| 3,483,350 | 12/1969 | Pohl | 219/121 EC |
| 3,617,686 | 11/1971 | Dietrich | 219/121 EB |
| 3,857,041 | 12/1974 | Spicer | 219/121 ES X |

Primary Examiner—C. L. Albritton
Attorney, Agent, or Firm—Thomas E. Beall, Jr.

[57] ABSTRACT

A vacuum chamber for welding in which to place a workpiece is hermetically connected to a vacuum chamber for an electron beam gun in which to place an electron beam gun, and the former is kept at a vacuum of $1\times10^{-4}$ Torr while the latter, at a vacuum of $1\times10^{-6}$ Torr. The distance between the electron beam gun and the surface of the workpiece is made greater than the mean free path of gas molecules and metal vapor molecules generated in treating, e.g., 1.85 m. Two focusing coils are arranged to prevent the expansion of the electron beams.

3 Claims, 5 Drawing Figures

METHOD OF TREATING A WORKPIECE WITH ELECTRON BEAMS AND APPARATUS THEREFOR

BACKGROUND OF THE INVENTION

This invention relates to an improvement in a method of treating a workpiece with electron beams and apparatus therefor.

An apparatus for treating a workpiece with electron beams an exemplified by an electron beam welder includes a vacuum chamber for welding in which the workpiece is placed and a vacuum chamber for an electron beam gun in which an electron beam generator is disposed and which is connected air-tight to the vacuum chamber for welding, and the electron beams are emitted towards the workpiece through an aperture bored on the exterior wall of the vacuum chamber for welding. Such an apparatus is disclosed, for example, in U.S. Pat. No. 3,617,686 granted to Dietrich on Nov. 2, 1971.

In the apparatus of the above-described kind, it is generally necessary to evacuate the vacuum chamber for welding and the vacuum chamber for an electron beam gun by means of a vacuum pump and to maintain them constantly at high vacuum of about $1 \times 10^{-4}$ Torr and about $1 \times 10^{-5} \sim 1 \times 10^{-6}$ Torr, respectively. However, gas components contained in the workpiece such as hydrogen and oxygen molecules of $H_2$ gas and $O_2$ gas and molecules of the workpiece converted into the metal vapor are emitted from the surface of the workpiece during welding and eventually lower the vacuum of both vaccum chambers. If a great number of molecules enter the vacuum chamber for an electron beam gun, insulation in the proximity of anode and cathode lowers whereby micro-discharge and flash-over discharge occur. The micro-discharge results in the formation of blow-holes at the weld zone while the flash-over discharge leads to the formation of recesses of the surface beads, blow-holes and sags. If the flash-over discharge occurs, furthermore, an excess current relay operates to stop the operation of the apparatus in order to protect the same.

These discharge phenomena take place frequently when the thickness of the workpiece exceeds 100 mm because the number of the gas molecules and that of the metal vapor molecules formed during welding increase with an increasing thickness of the workpiece. When a 100 mm-thick killed steel is welded, for example, the micro-discharge occurs 1–5 times within 10 minutes and the flash-over discharge occurs about once in 20 minutes. The vacuum in this instance is $1 \times 10^{-3}$ Torr near the aperture bored on the exterior wall of the vacuum chamber for welding, $1 \times 10^{-2}$ Torr near the workpiece and $10^{-5} \sim 10^{-6}$ Torr inside the vacuum chamber for an electron beam gun. In this case, the pressure difference between the portion near the aperture of the vacuum chamber for welding and the vacuum chamber for an electron beam gun reaches as large as $10^2$–$10^3$ Torr so that the gas and metal molecules are apt to be sucked into the vacuum chamber for an electron beam gun. In consequence, the molecules emitted from the surface of the workpiece enter the vacuum chamber for an electron beam gun and lower instantaneously the vauum near the anode and cathode down to $10^{-3}$–$10^{-4}$ Torr, thereby causing the discharge phenomena. Because of these discharge phenomena, it has been difficult in the conventional apparatus to weld, cut or bore a workpiece of a thickness of 100 mm or more by means of the electron beams.

SUMMARY OF THE INVENTION

It is therefore an object of the present invention to provide a suitable method of treating a thick workpiece with electron beams and apparatus therefor.

It is another object of the present invention to provide a method of treating a workpiece with electron beams which is free from the occurrence of discharge phenomena in the electron beam generator during treatment, and apparatus for said method.

It is still another object of the present invention to provide an apparatus for treating a workpiece with electron beams which makes it easy to adjust the axis of the electron beams.

It is one of the characterizing features of the present invention that the distance between the electron gun and the surface of the workpiece is made greater than the mean free path of the gas molecules and metal vapor molecules that are generated during treatment.

The discharge near the anode and cathode forming the electron beam gun occurs because the gas molecules and metal vapor molecules generated from the workpiece during treatment reach the electron beam gun. The molecules that are emitted from the surface of the workpiece with kinetic energy can travel in the space only by their free path. If the workpiece is spaced apart from the electron beam gun by a distance greater than the mean free path of the gas molecules and metal vapor molecules during treatment, therefore, the number of molecules capable of reaching the electron beam gun becomes smaller and hence, the discharge phenomena can be checked.

DESCRIPTION OF THE PREFERRED EMBODIMENTS

Figure 1:
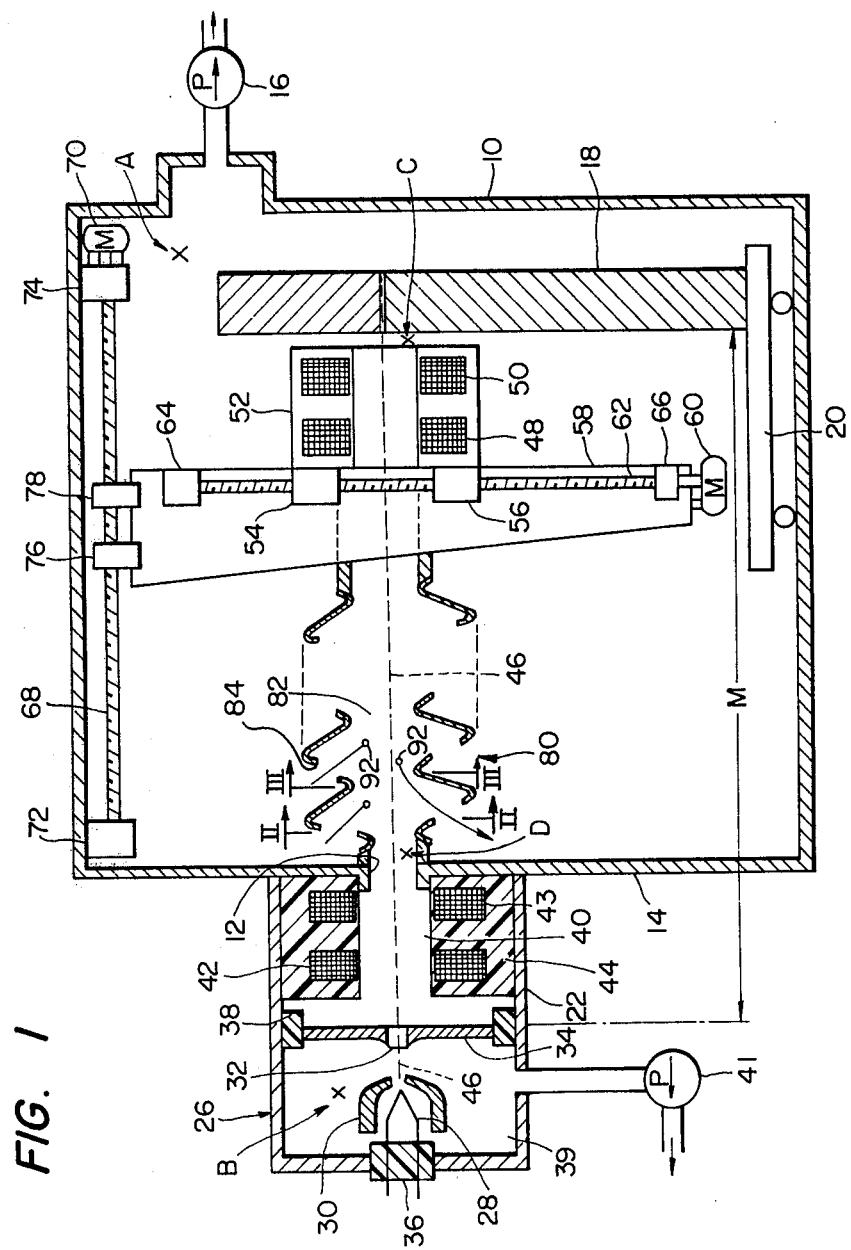
FIG. 1 is a sectional view showing an embodiment of the present invention.

In FIG. 1, a sealed vacuum chamber for welding 10 has a front wall 14 provided with an aperture 12. The vacuum chamber 10 is shaped into a rectangular parallelopiped having a length of 6.5 m, a width of 6.5 m and a height of 3.5 m, for example, and is constantly kept at a high vacuum of $1 \times 10^{-4}$ Torr by means of a vacuum pump 16. In order to movably support a workpiece 18 to be welded inside the vacuum chamber 10, a work table 20 is disposed in the chamber.

A vacuum chamber 22 is disposed to oppose the aperture 12 of the vacuum chamber 10 and is connected air-tight to the vacuum chamber 10. An electron beam gun 26 consists of a tungsten ribbon type filament 28, a grid or cathode 30 and an anode 34 equipped with an aperture 32. These members are fixed inside the vacuum chamber 22 via insulators 36 and 38 and are electrically connected to a power source not shown. The vacuum chamber 22 is divided by the anode 34 into chambers 39 and 40 whereby the chamber 39 furnished with the filament 28 is constantly kept at a high vacuum of $1\times10^{-5} \sim 1\times10^{-6}$ Torr by means of a vacuum pump 41.

A focusing coil 42 and a deflecting coil 43 are disposed on the downstream side of the anode 34 inside the vacuum chamber 22. A coil bobbin 44 is fixed onto the inner circumference of the vacuum chamber 22 and supports the focusing coil 42 and the deflecting coil 43. When the filament 28 is heated, electrons are emitted from the grid or cathode 30. The electron beams are irradiated into the vacuum chamber 10 through the aperture 32 of the anode, the focusing coil 42, the deflecting coil 43 and the aperture 12 of the vacuum chamber 10 as shown in the drawing, and the beam intensity is so selected as to sufficiently pierce and fuse the workpiece.

A focusing coil 48 and a deflecting coil 50 are arranged to oppose the workpiece placed inside the vacuum chamber 10. A coil bobbin 52 is equipped with screw coupling members 54 and 56 and supports the focusing coil 48 and the deflecting coil 50 and permits them to move vertically inside the vacuum chamber 10. A support 58, which is supported movably in the horizontal direction inside the vacuum chamber 10, is equipped with a screw 62 and bearings 64, 66 that are rotated by a motor 60. When the motor 60 is energized by the power source not shown to rotate the screw 62, the coupling members 54 and 56 screw-coupled to the screw 62 are caused to move up or down.

At the upper portion of the vacuum chamber 10 are disposed a screw 68 extending in the horizontal direction, a motor 70 for rotating this screw 68 and bearings 72, 74. Screw coupling members 76, 78 fixed to the abovementioned support 58 are brought into screw engagement with this screw 68 and are supported movably in the horizontal direction inside the vacuum chamber 10. When the motor 70 is energized by the power source not shown thereby to rotate the screw 68, the members 76, 78 coupled to the screw 68 move rightwardly or leftwardly. The moving direction of the support 58 is in conformity with the axis of the electron beam 46.

Figure 2:
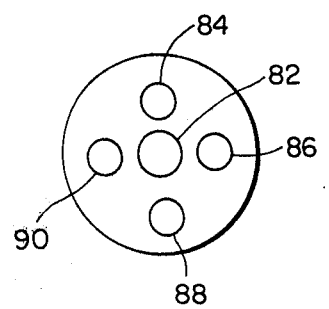
FIG. 2 is a sectional view taken along line II—II of FIG. 1.
Figure 3:
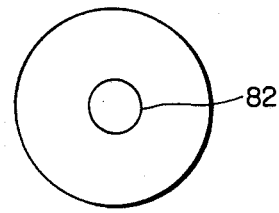
FIG. 3 is a sectional view taken along line III— III of FIG. 1.

An electron beam guide 80 of the bellows-like form is interposed between the focusing coil 48 and the deflecting coil 43. As illustrated in FIG. 2, a beam path 82, and exhaust apertures 84, 86, 88 and 90 are defined on this electron beam guide 80. This arrangement prevents the diffusion, into the electron beam path, of the molecules of gas and metal vapor that are generated upon irradiation of the electron beam onto the workpiece. The molecules 92 inside the electron beam guide 80 are discharged into the vacuum chamber 10 through the exhaust apertures 84, 86, 88, 90 as shown in FIG. 1.

In FIG. 1, when the filament 28, the cathode 30, the anode 34, the focusing coils 42, 48 and the deflecting coils 43, 50 are altogether connected to the power source, the electron beam 46 emitted from the electron beam gun 26 passes horizontally through the focusing coil 42, the deflecting coil 43, the electron beam guide 80 of the bellows-like form, the focusing coil 48 and through the deflecting coil 50 and is irradiated upon the workpiece 18. If the distance M between the anode 34 and the workpiece 18 becomes great, the electron beam 46 expands but is again focused by the focusing coil 48 that is disposed in the proximity of the workpiece. The focusing coil 48 and the deflecting coil 50 are moved in the vertical direction so as to bring the axis of the electron beam 46 emitted from the electron beam gun 26 into conformity with the axes of the focusing coil 48 and deflecting coil 50. This correction is made by controlling the operation of the motor 60.

The distance M between the anode 34 and the workpiece is controlled by controlling the operation of the motor 70. The rear wall of the vacuum chamber 10 and the anode 34 are selected sufficiently great in order to make the distance M greater than the mean free path of the molecules of the gas and metal vapor generated during the welding such as hydrogen and oxygen molecules. In this embodiment, the distance M is at least 1.85 m.

When the workpiece is a 100 mm-thick carbon steel and the distance between the focusing coil 40 and the workpiece 18 is 2.5 m in FIG. 1, the vacuum is $1\times10^{-4}$ Torr at point A in the vacuum chamber 10, $1\times10^{-5} \sim 1\times10^{-6}$ Torr at point B in the vacuum chamber 39, $1\times10^{-2}$ Torr at point C in front of the workpiece 18 and $1\times10^{-4}$ Torr at point D close to the aperture 12, respectively. In other words, it is possible to maintain the vacuum of at least $1\times10^{-4}$ Torr near the aperture 12 during welding.

As a result, the micro-discharge generated by the electron beam gun 26 is less than once in 60 minutes and the flash-over discharge is not at all observed. This is because the distance M between the workpiece 18 and the anode 34 is so large that the metal vapor and gas molecules generated at the weld zone are evacuated outside by the vacuum pump 16, thereby reducing their quantity sucked into the vacuum chamber 39 for the electron beam gun through the aperture 32 of the anode 34.

Figure 4:
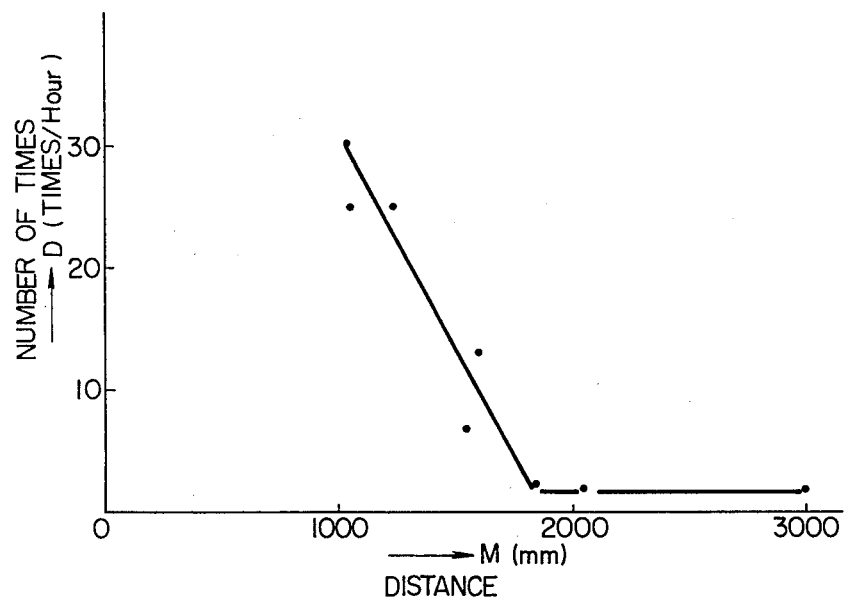
FIG. 4 is a diagram showing the relationship between the number of times of discharge D and the distance M between the electron beam gun and the workpiece.

FIG. 4 illustrates the relationship between the number of times of occurrence of the micro-discharge and the distance M between the anode 34 and the workpiece 18. As can be seen, the number of times of occurrence of the micro-discharge decreases drastically when the distance M exceeds 1.85 m. This is because the mean free path of the metal vapor and gas molecules during welding is about 1.85 m and when the distance M becomes smaller than this mean free path, the metal vapor molecules and gas molecules are allowed to enter the vacuum chamber for the electron beam gun 39 in greater quantities.

Figure 5:
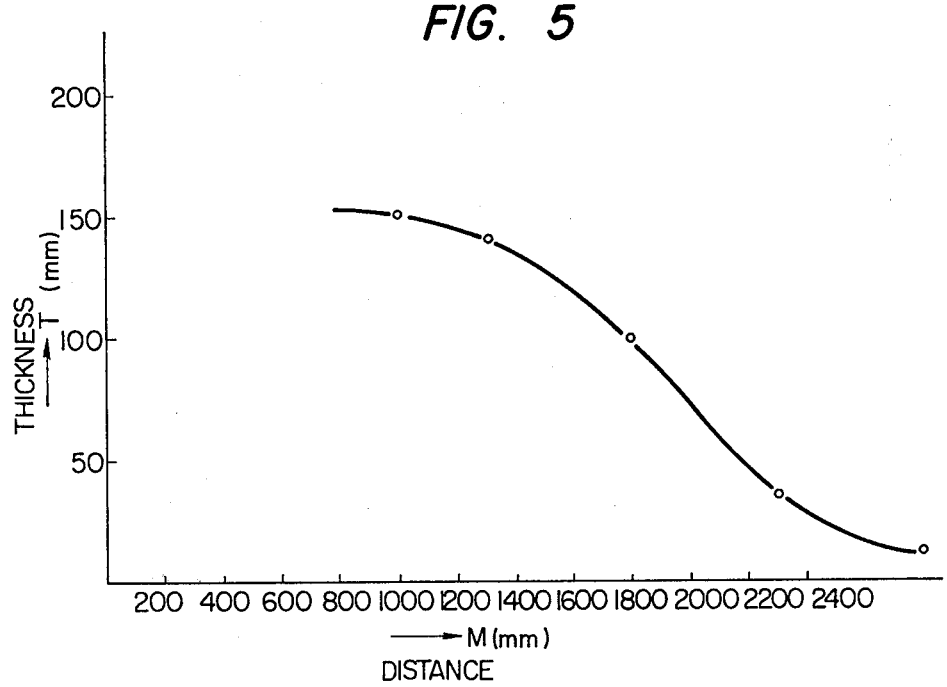
FIG. 5 is a diagram showing the relationship between the thickness T that piercing-welding can attain and the distance M between the electron beam gun and the workpiece.

FIG. 5 is a diagram useful for explaining the effect of the focusing coil 48 of FIG. 1 wherein the relationship between the thickness T of the workpiece that can be pierce-welded and the distance M between the anode 34 and the workpiece 18 is shown, without coil 48. The focusing property of the focusing coil 42 for the electron beam 46 decreases with the increase in the distance M whereby scattering of the beam becomes greater and the weldable thickness of the workpiece becomes smaller. In the case of the embodiment of FIG. 1, the focusing coil 48 is placed immediately before the workpiece 18 so that the electron beam is again focused. When the workpiece is thick, therefore, welding can be practised even if the distance M is made greater than 1.85 m, thereby preventing the discharge phenomena.

In the embodiment shown in FIG. 1, both focusing coil 48 and deflecting coil 50 are shown disposed inside the vacuum chamber 10. However, they may be disposed inside the vacuum chamber 22 by increasing the length of the chamber 22. In such a case, the size of the vacuum chamber 10 can be reduced.

What is claimed is:

1. An apparatus for treating a workpiece with electron beams comprising:

a first vacuum chamber;

an electron beam gun disposed in said first vacuum chamber for generating electron beams, said electron beam gun including a filament, a grid or cathode, and an anode with an aperture;

a first focusing coil disposed on the downstream side of said anode of said electron beam gun for focusing the electron beams on said workpiece to be treated;

a first deflecting coil disposed on the downstream side of said first focusing coil;

a second vacuum chamber having a front wall with an aperture and a rear wall and enclosing said workpiece therein, said second vacuum chamber hermetically fixed to said first vacuum chamber, and said aperture of said second vacuum chamber opposed said aperture of said anode of said electron beam gun;

the distance between the rear wall of said second vacuum chamber and said anode of said electron beam gun being such that said workpiece is allowed to separate from said anode of said electron beam gun by a distance larger than the mean free path of gas molecules generated in treating said workpiece;

a second focusing coil disposed between said aperture of said second vacuum chamber and said workpiece in said second vacuum chamber, for focusing the electron beams on said workpiece; and a second deflecting coil disposed on the downstream side of said second focusing coil in said second vacuum chamber.

2. The apparatus for treating workpiece with electron beams as set forth in claim 1 wherein said workpiece is allowed to separate from said anode of said electron beam gun by at least 1.85 m.

3. The apparatus for treating workpiece with electron beams as set forth in claim 1 wherein said second focusing coil and said second deflecting coil are adjustably mounted in said second vacuum chamber and allowed to move in both horizontal and vertical directions.

* * * * *